US008077751B2

United States Patent
Baba et al.

(10) Patent No.: US 8,077,751 B2
(45) Date of Patent: Dec. 13, 2011

(54) BAR-SHAPED SEMICONDUCTOR LASER CHIP AND METHOD OF FABRICATION THEREOF

(75) Inventors: Yasuo Baba, Tottori (JP); Yasuhiko Matsushita, Tottori (JP); Yukio Gotoh, Tottori (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 12/573,227

(22) Filed: Oct. 5, 2009

(65) Prior Publication Data

US 2010/0103968 A1  Apr. 29, 2010

(30) Foreign Application Priority Data

Oct. 28, 2008  (JP) ................................. 2008-276788

(51) Int. Cl.
*H01S 5/00* (2006.01)
(52) U.S. Cl. ................................ 372/44.011; 372/50.12
(58) Field of Classification Search ............ 372/44.011, 372/50.12, 50.1, 50.121
See application file for complete search history.

(56) References Cited

U.S. PATENT DOCUMENTS

2006/0094244 A1 * 5/2006 Yamada et al. ............... 438/700

FOREIGN PATENT DOCUMENTS

JP  2008-205171 A  9/2008

* cited by examiner

*Primary Examiner* — Patrick Stafford
(74) *Attorney, Agent, or Firm* — Marvin A. Motsenbocker; Mots Law, PLLC

(57) ABSTRACT

A bar-shaped semiconductor laser chip that can hold down a variation in oscillation wavelength is provided. The bar-shaped semiconductor laser chip has a nitride semiconductor substrate and a semiconductor layer formed on the main surface of the nitride semiconductor substrate and including a plurality of laser chip portions. The plurality of laser chip portions are arrayed in the [11-20] direction. The main surface of the nitride semiconductor substrate is a (0001) plane having an off-angle in the direction along the [11-20] direction. The central part of the main surface of the nitride semiconductor substrate has an off-angle of 0.05±0.1 degrees from the (0001) plane in the direction along the [11-20] direction.

7 Claims, 3 Drawing Sheets

BAR-SHAPED SEMICONDUCTOR LASER CHIP AND METHOD OF FABRICATION THEREOF

This application is based on Japanese Patent Application No. 2008-276788 filed on Oct. 28, 2008, the contents of which are hereby incorporated by reference.

BACKGROUND OF THE INVENTION

1. Field of the Invention

The present invention relates to a bar-shaped semiconductor laser chip comprising a nitride semiconductor substrate, and to a method for fabricating such a semiconductor laser chip.

2. Description of Related Art

There have conventionally been known semiconductor laser chips comprising a nitride semiconductor substrate. For example, one such semiconductor laser chip is disclosed in JP-A-2008-205171.

JP-A-2008-205171 mentioned above discloses a nitride semiconductor laser chip which comprises: a substrate formed of a nitride semiconductor; an n-side semiconductor layer, an active layer, a p-side semiconductor layer, and a p-electrode formed on the main (obverse) surface of the substrate; and an n-electrode formed on the back (reverse) surface of the substrate.

In this nitride semiconductor laser chip, the resonator (cavity) facets lie on the (1-100) plane. That is, the resonator facets are formed so as to extend in the [11-20] direction.

On the other hand, there have conventionally been known bar-shaped semiconductor laser chips comprising a nitride semiconductor substrate. A bar-shaped semiconductor laser chip is formed by arraying a plurality of laser chip portions in a predetermined direction.

When such a bar-shaped semiconductor laser chip is formed by use of, for example, the nitride semiconductor laser chip disclosed in JP-A-2008-205171 mentioned above, the bar-shaped semiconductor laser chip is formed so as to extend in the [11-20] direction. That is, the bar-shaped semiconductor laser chip is formed in the shape of a bar having laser chip portions (individual nitride semiconductor laser chips) arrayed in the [11-20] direction.

Inconveniently, however, since the off-angle of the nitride semiconductor substrate is not uniform over its surface, in a bar-shaped semiconductor laser chip, the off-angle of the nitride semiconductor substrate varies among the individual laser chip portions. Thus, in a case where, as in the bar-shaped semiconductor laser chip mentioned above, the laser chip portions (individual nitride semiconductor laser chips) are arrayed in the [11-20] direction, their oscillation wavelength (lasing wavelength) gradually increases (or decreases) in the [11-20] direction. This brings the problem of a large difference between the oscillation wavelength of the endmost laser chip portion in the [11-20] direction and the oscillation wavelength of the endmost laser chip portion in the [-1-120] direction, which is to say the problem that the bar-shaped semiconductor laser chip suffers from a large variation in oscillation wavelength.

A bar-shaped semiconductor laser chip with a large variation in oscillation wavelength is disadvantageous because it, for example when used as a light source in an exposure machine, makes uniform exposure difficult.

SUMMARY OF THE INVENTION

The present invention has been devised to solve the problems mentioned above, and an object of the invention is to provide a bar-shaped semiconductor laser chip that can hold down a variation in oscillation wavelength, and to provide a method for fabricating such a semiconductor laser chip.

To achieve the above object, according to a first aspect of the invention, a bar-shaped semiconductor laser chip is provided with: a nitride semiconductor substrate; and a semiconductor layer formed on the main surface of the nitride semiconductor substrate and including a plurality of laser chip portions. Here, the plurality of laser chip portions are arrayed in the [11-20] direction; the main surface of the nitride semiconductor substrate is a (0001) plane having an off-angle in the direction along the [11-20] direction; and the central part of the main surface of the nitride semiconductor substrate has an off-angle of 0.05±0.1 degrees from the (0001) plane in the direction along the [11-20] direction.

In this bar-shaped semiconductor laser chip according to the first aspect of the invention, as described above, by giving the central part of the main surface of the nitride semiconductor substrate an off-angle of 0.05±0.1 degrees from the (0001) plane in the direction along the [11-20] direction, it is possible to hold down a difference in oscillation wavelength between, of the plurality of laser chip portions, the endmost one in the [11-20] direction and the endmost one in the [-1-120] direction. That is, it is possible to hold down a variation in the oscillation wavelength of the bar-shaped semiconductor laser chip.

In the above-described bar-shaped semiconductor laser chip according to the first aspect of the invention, preferably, when the off-angle of the main surface of the nitride semiconductor substrate decreases in the [11-20] direction, the central part of the main surface of the nitride semiconductor substrate has an off-angle of 0.05±0.1 degrees as measured, while facing in the [11-20] direction, from the (0001) plane to the [0001]-direction side, and when the off-angle of the main surface of the nitride semiconductor substrate increases in the [11-20] direction, the central part of the main surface of the nitride semiconductor substrate has an off-angle of 0.05±0.1 degrees as measured, while facing in the [-1-120] direction, from the (0001) plane to the [0001]-direction side. With this structure, it is possible to easily hold down a difference in oscillation wavelength between the endmost laser chip portion in the [11-20] direction and the endmost laser chip portion in the [-1-120] direction.

In the above-described bar-shaped semiconductor laser chip according to the first aspect of the invention, preferably, the central part of the main surface of the nitride semiconductor substrate has an off-angle larger than 0 degrees but smaller than 0.1 degrees from the (0001) plane in the direction along the [11-20] direction. With this structure, it is possible to more effectively hold down a difference in oscillation wavelength between, of the plurality of laser chip portions, the endmost one in the [11-20] direction and the endmost one in the [-1-120] direction. That is, it is possible to more effectively hold down a variation in the oscillation wavelength of the bar-shaped semiconductor laser chip.

In the above-described bar-shaped semiconductor laser chip according to the first aspect of the invention, preferably, the difference in oscillation wavelength between the endmost laser chip portion in the [11-20] direction and the endmost laser chip portion in the [-1-120] direction is 2 nm or less. With this structure, it is possible to hold down the variation in the oscillation wavelength of the bar-shaped semiconductor laser chip to 2 nm or less; thus, it is possible to satisfactorily reduce the variation in the oscillation wavelength of the bar-shaped semiconductor laser chip.

According to a second aspect of the invention, a method for fabricating a bar-shaped semiconductor laser chip involves: a step of preparing a wafer formed of a nitride semiconductor; a step of forming on the main surface of the wafer a semiconductor layer to be formed into laser chip portions; and a step of splitting the wafer into bars each having a plurality of the laser chip portions arrayed in the [11-20] direction. Here, the main surface of the wafer is a (0001) plane having an off-angle in the direction along the [11-20] direction, and the central part of the main surface of the wafer has an off-angle of 0.05±0.1 degrees from the (0001) plane in the direction along the [11-20] direction.

In this method for fabricating a bar-shaped semiconductor laser chip according to the second aspect of the invention, as described above, by giving the central part of the main surface of the wafer an off-angle of 0.05±0.1 degrees from the (0001) plane in the direction along the [11-20] direction, it is possible to hold down a difference in oscillation wavelength between, of the plurality of laser chip portions, the endmost one in the [11-20] direction and the endmost one in the [-1-120] direction. That is, it is possible to hold down a variation in the oscillation wavelength of the bar-shaped semiconductor laser chip.

In the above-described method for fabricating a bar-shaped semiconductor laser chip according to the second aspect of the invention, preferably, when the off-angle of the main surface of the wafer decreases in the [11-20] direction, the central part of the main surface of the wafer has an off-angle of 0.05±0.1 degrees as measured, while facing in the [11-20] direction, from the (0001) plane to the [0001]-direction side, and when the off-angle of the main surface of the wafer increases in the [11-20] direction, the central part of the main surface of the wafer has an off-angle of 0.05±0.1 degrees as measured, while facing in the [-1-120] direction, from the (0001) plane to the [0001]-direction side. With this design, it is possible to easily hold down a difference in oscillation wavelength between the endmost laser chip portion in the [11-20] direction and the endmost laser chip portion in the [-1-120] direction.

DETAILED DESCRIPTION OF PREFERRED EMBODIMENTS

First, with reference to FIGS. 1 to 4, the structure of a bar-shaped semiconductor laser chip 1 according to one embodiment of the invention will be described.

Figure 1:
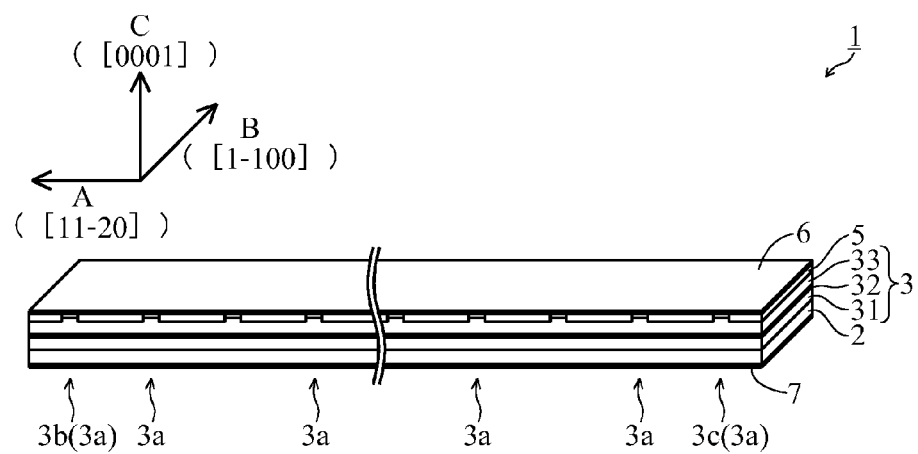
FIG. 1 is a perspective view showing the structure of a bar-shaped semiconductor laser chip according to one embodiment of the invention.

As shown in FIG. 1, the bar-shaped semiconductor laser chip 1 according to one embodiment of the invention is formed in the shape of a bar extending in direction A (the [11-20] direction), and is for use as, for example, a light source in an exposure machine or the like. The bar-shaped semiconductor laser chip 1 has, for example, a length of about 10 mm to about 20 mm in direction A (the [11-20] direction) and a width of about 200 μm in direction B (the [1-100] direction). The bar-shaped semiconductor laser chip 1 has a plurality of (several tens to several hundred) laser chip portions 3a—described later—formed therein, which are arrayed in direction A (the [11-20] direction).

Figure 2:
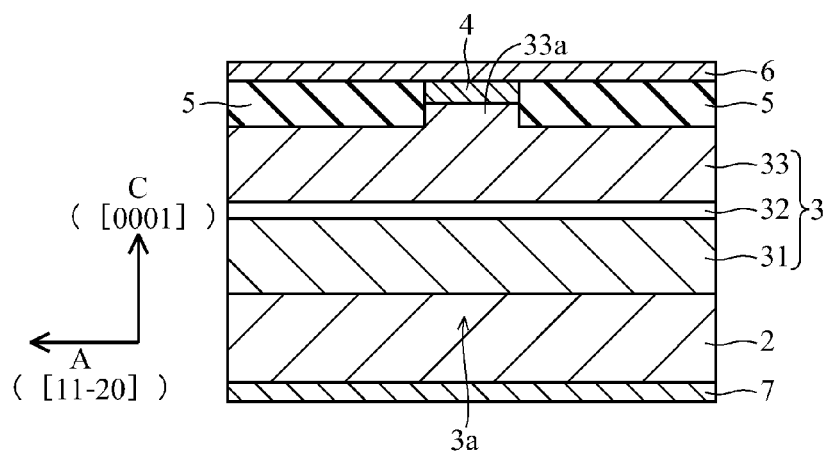
FIG. 2 is a sectional view showing the structure of the bar-shaped semiconductor laser chip according to one embodiment of the invention shown in FIG. 1.

As shown in FIG. 2, the bar-shaped semiconductor laser chip 1 is composed of: a GaN substrate 2; a semiconductor layer 3 formed on the main (obverse) surface of the GaN substrate 2 and formed of a nitride semiconductor; a p-side electrode 4 and an insulating film 5 formed on predetermined regions of the semiconductor layer 3; a pad electrode 6 formed on the p-side electrode 4 and the insulating film 5 and formed of a metal layer; and an n-side electrode 7 formed on the back (reverse) surface of the GaN substrate 2 and formed of a metal layer. It should be understood that the GaN substrate 2 is one example of a "nitride semiconductor substrate" according to the invention.

The main surface of the GaN substrate 2 is a (0001) plane having a predetermined off-angle in the direction along direction A (the [11-20] direction). That is, the main surface of the GaN substrate 2 is a surface inclined relative to the (0001) plane by a predetermined angle along direction A (the [11-20] direction).

Figure 3:
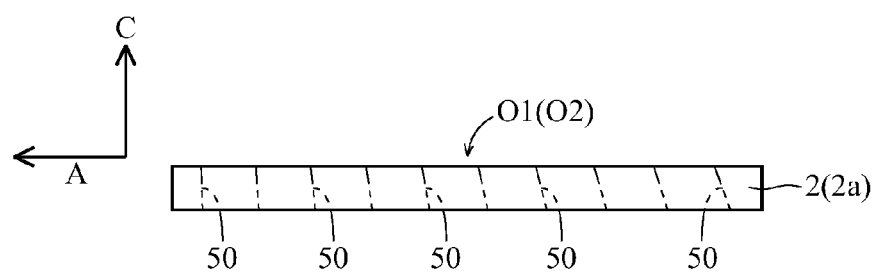
FIG. 3 is a sectional view illustrating the off-angle of the GaN substrate in the bar-shaped semiconductor laser chip according to one embodiment of the invention shown in FIG. 1.

Specifically, in this embodiment, as shown in FIG. 3, the off-angle of the GaN substrate 2 gradually decreases in direction A (the [11-20] direction). That is, the C-axis (the axis extending in the [0001] direction) of the GaN substrate 2 has a varying inclination over the surface of the GaN substrate 2. The angle formed between the C-axis 50 and the axis (unillustrated) perpendicular to the main surface of the GaN substrate 2 as measured on the direction-A ([11-20]-direction) side of the GaN substrate 2 is smaller than the same angle as measured on the opposite-to-direction-A ([-1-120]-direction) side of the GaN substrate 2.

Figure 4:
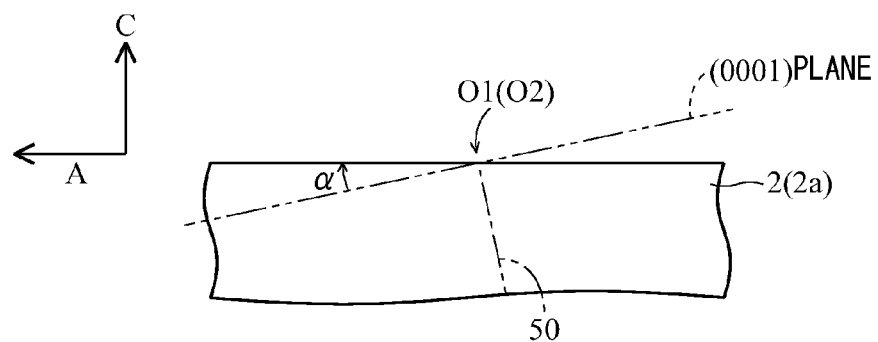
FIG. 4 is an enlarged sectional view showing the structure of a central part of the main surface of the GaN substrate in the bar-shaped semiconductor laser chip according to one embodiment of the invention shown in FIG. 1.

Moreover, in this embodiment, as shown in FIG. 4, a central part O1 of the main surface of the GaN substrate 2 has an off-angle α of about 0.05±0.1 degrees as measured, while facing in direction A (the [11-20] direction) (i.e., on the direction-A side), from the (0001) plane to the direction-C ([0001]-direction) side. More preferably, the central part O1 of the main surface of the GaN substrate 2 has an off-angle α larger than about 0 degrees but smaller than about 0.1 degrees as measured, while facing in direction A (the [11-20] direction), from the (0001) plane to the direction-C ([0001]-direction) side.

As shown in FIG. 2, the semiconductor layer 3 includes an n-type semiconductor layer 31 formed on the GaN substrate 2, an active layer 32 formed on the n-type semiconductor layer 31, and a p-type semiconductor layer 33 formed on the active layer 32.

Moreover, as shown in FIG. 1, the semiconductor layer 3 (the n-type semiconductor layer 31, the active layer 32, and the p-type semiconductor layer 33) forms a plurality of laser chip portions 3a arrayed in direction A (the [11-20] direction).

In each laser chip portion 3a, as shown in FIG. 2, in a central part of the p-type semiconductor layer 33 in the length direction (the direction along direction A), there is formed a ridge portion 33a extending in direction B (see FIG. 1).

The resonator (cavity) facets of each laser chip portion 3a (the bar-shaped semiconductor laser chip 1) are formed so as to extend in direction A (the [11-20] direction).

Moreover, in this embodiment, the difference between the oscillation wavelength (lasing wavelength) of the endmost laser chip portion 3b (see FIG. 1) in direction A (the [11-20] direction) and the oscillation wavelength of the endmost laser chip portion 3c (see FIG. 1) in the direction (the [-1-120] direction) opposite to direction A is about 2 nm or less. It should be understood that the laser chip portion 3b is one example of an "endmost laser chip portion in the [11-20] direction" according to the invention, and that the laser chip portion 3c is one example of an "endmost laser chip portion in the [-1-120] direction" according to the invention.

The p-side electrode 4 is formed of a metal layer, and is formed on the ridge portion 33a.

The insulating film 5 is formed of a SiO$_2$ film or the like, and is formed on the top surface of the p-type semiconductor layer 33 elsewhere than on the ridge portion 33a.

Next, with reference to FIGS. 1 to 5, the fabrication process of the bar-shaped semiconductor laser chip 1 according to the embodiment will be described.

Figure 5:
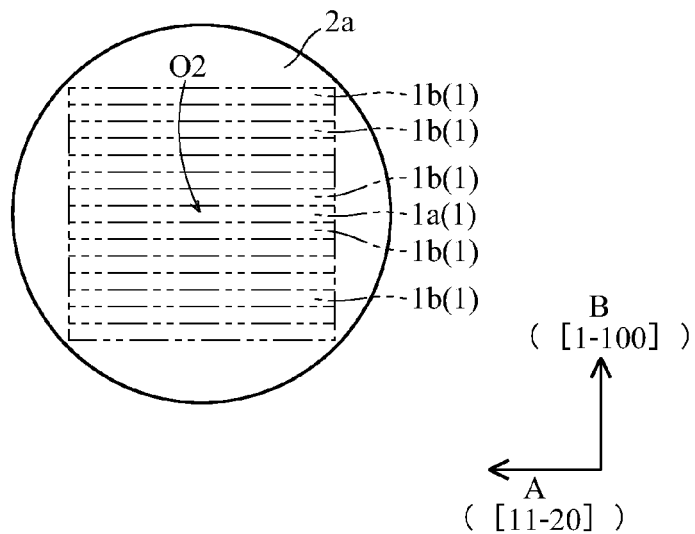
FIG. 5 is a plan view illustrating the fabrication method of the bar-shaped semiconductor laser chip according to one embodiment of the invention shown in FIG. 1.

First, as shown in FIG. 5, a wafer 2a formed of GaN and having a diameter of, for example, two inches is prepared. It should be understood that GaN is one example of a "nitride semiconductor" according to the invention.

Here, as shown in FIG. 3, the main surface of the wafer 2a prepared is a (0001) plane having an off-angle decreasing in direction A (the [11-20] direction). Moreover, as shown in FIG. 4, the central part O2 of the main surface of the wafer 2a has an off-angle α of about 0.05±0.1 degrees as measured, while facing in direction A (the [11-20] direction), from the (0001) plane to the direction-C ([0001]-direction) side. Moreover, the off-angle of the wafer 2a over its surface is symmetric about a line (unillustrated) passing through the central part O2 and extending in direction A (the [11-20] direction), between direction B (the [1-100] direction) and the direction (the [-1100] direction) opposite to direction B.

Then, as shown in FIG. 2, on the main surface of the wafer 2a, through crystal growth by MOCVD (metalorganic chemical vapor deposition) or the like, the n-type semiconductor layer 31, the active layer 32, and the p-type semiconductor layer 33 are formed. Thereafter, on the p-type semiconductor layer 33, the p-side electrode 4 is formed.

Then, by use of a mask (unillustrated), the p-side electrode 4 and the p-type semiconductor layer 33 are etched from the top surface of the former halfway into the thickness of the latter to form, in the p-type semiconductor layer 33, a plurality of ridge portions 33a at predetermined intervals in direction A. In this way, a plurality of (several tens to several hundred) laser chip portions 3a arrayed in direction A (the [11-20] direction) are formed.

Thereafter, on the p-type semiconductor layer 33, elsewhere than on the ridge portion 33a, the insulating film 5 formed of a SiO$_2$ film or the like is formed.

Then, on the p-side electrode 4 and the insulating film 5, the pad electrode 6 formed of a metal layer is formed. In addition, on the bottom (back) surface, the n-side electrode 7 formed of a metal layer is formed.

Then, as shown in FIGS. 1 and 5, the wafer 2a (see FIG. 5) is split into bars each having a plurality of laser chip portions 3a (see FIG. 1) arrayed in direction A (the [11-20] direction).

In the manner described above, the bar-shaped semiconductor laser chip 1 according to the embodiment is fabricated.

In this embodiment, as described above, the main surface of the GaN substrate 2 is given an off-angle gradually decreasing in direction A (the [11-20] direction), and the central part O1 of the main surface of the GaN substrate 2 is given an off-angle α of about 0.05±0.1 degrees as measured, while facing in direction A (the [11-20] direction), from the (0001) plane to the direction-C ([0001]-direction) side. This makes it possible to hold down the difference between the oscillation wavelength of the endmost laser chip portion 3b in direction A (the [11-20] direction) and the oscillation wavelength of the endmost laser chip portion 3c in the direction (the [-1-120] direction) opposite to direction A. That is, it is possible to hold down a variation in the oscillation wavelength of the bar-shaped semiconductor laser chip 1. This, for example when the bar-shaped semiconductor laser chip 1 is used as a light source in an exposure machine, makes uniform exposure possible.

By giving the central part O1 of the main surface of the GaN substrate 2 an off-angle α larger than 0 degrees but smaller than 0.1 decrees from the (0001) plane in the direction along direction A (the [11-20] direction) as described above, it is possible to more effectively hold down the difference between the oscillation wavelength of the endmost laser chip portion 3b in direction A (the [11-20] direction) and the oscillation wavelength of the endmost laser chip portion 3c in the direction (the [-1-120] direction) opposite to direction A. In this way, it is possible to more effectively hold down a variation in the oscillation wavelength of the bar-shaped semiconductor laser chip 1.

Moreover, in this embodiment, as described above, the difference between the oscillation wavelength of the endmost laser chip portion 3b in direction A (the [11-20] direction) and the oscillation wavelength of the endmost laser chip portion 3c in the direction (the [-1-120] direction) opposite to direction A is made as small as about 2 nm or less. This makes it possible to satisfactorily reduce the variation in the oscillation wavelength of the bar-shaped semiconductor laser chip 1.

Next, a description will be given of an experiment conducted to confirm the effect of the bar-shaped semiconductor laser chip 1 according to the one embodiment of the invention described above. In this experiment, a bar-shaped semiconductor laser chip was fabricated by the fabrication process described above, and the variation of the oscillation wavelength of the bar-shaped semiconductor laser chip was evaluated. The details are as follows.

First, a wafer was prepared of which the central part of the main surface had a predetermined off-angle as measured, while facing in direction A (the [11-20] direction), from the (0001) plane to the direction-C ([0001]-direction) side. In fact, in this experiment, a plurality of such wafers were prepared of which the central part of the main surface had varying off-angles of about −0.24 degrees to about 0.18 degrees.

Then, by the fabrication process described above, bar-shaped semiconductor laser chips were fabricated from those different wafers.

The fabrication process of the bar-shaped semiconductor laser chips here is in every other aspect similar to that in the embodiment described above.

Next, with each bar-shaped semiconductor laser chip fabricated, the oscillation wavelength of the endmost laser chip portion in direction A (the [11-20] direction) and the oscillation wavelength of the endmost laser chip portion in the direction (the [-1-120] direction) opposite to direction A were measured.

Then, the oscillation wavelength of the endmost laser chip portion in the direction opposite to direction A was subtracted from the oscillation wavelength of the endmost laser chip portion in direction A to calculate the difference in oscillation wavelength within the bar-shaped semiconductor laser chip. The absolute value of this difference in oscillation wavelength is the variation in the oscillation wavelength of the bar-shaped semiconductor laser chip.

In this experiment, with each wafer, the difference in oscillation wavelength was calculated only with respect to the bar-shaped semiconductor laser chip 1a (see FIG. 5) including the central part of the wafer. This is because the bar-shaped semiconductor laser chip 1a including the central part of the wafer has a greater difference in oscillation wavelength than a bar-shaped semiconductor laser chip 1b (see FIG. 5) not including the central part of the wafer.

Then, the relationship between the off-angle of the central part of the main surface of the wafer and the difference in oscillation wavelength was plotted on a graph. The result is shown in FIG. 6.

Figure 6:
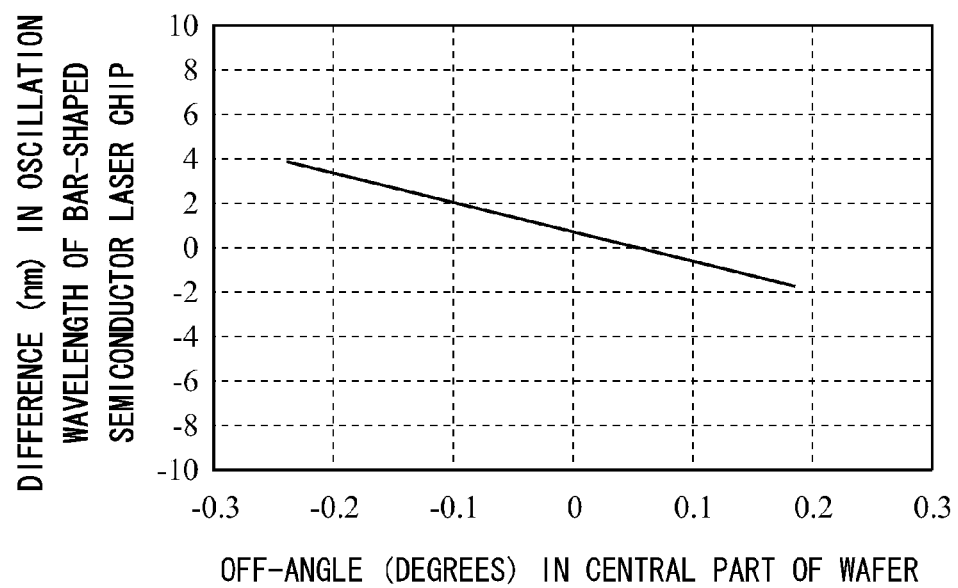
FIG. 6 is a diagram illustrating an experiment conducted to confirm the effect of the bar-shaped semiconductor laser chip according to one embodiment of the invention.

As FIG. 6 shows, it was found that, with the off-angle of the central part of the main surface of the wafer in the range of about 0.05±0.1 degrees, the variation in the oscillation wavelength of the bar-shaped semiconductor laser chip was small.

Specifically, with the off-angle of the central part of the main surface of the wafer in the range of about −0.05 degrees to about 0.15 degrees (about 0.05±0.1 degrees), the difference in the oscillation wavelength of the bar-shaped semiconductor laser chip was about 1.2 nm to about −1.2 nm. That is, the variation of the oscillation wavelength of the bar-shaped semiconductor laser chip was about 1.2 nm or less.

With the off-angle of the central part of the main surface of the wafer larger than about 0 degrees but smaller than about 0.1 degrees, the difference in the oscillation wavelength of the bar-shaped semiconductor laser chip was about 0.7 nm to about −0.7 nm. That is, the variation of the oscillation wavelength of the bar-shaped semiconductor laser chip was about 0.7 nm or less.

Moreover, with the off-angle of the central part of the main surface of the wafer about 0.05 degrees, the difference and variation in the oscillation wavelength of the bar-shaped semiconductor laser chip was at its minimum.

It should be understood that the embodiment disclosed in the present specification is in all aspects merely illustrative and not restrictive. The scope of the present invention is defined not by the above description of the embodiment but by the appended claims, and encompasses any modifications in the sense equivalent to, and within the spirit of, those claims.

For example, although the embodiment described above deals with an example where GaN is used as the nitride semiconductor, this is not meant to limit the invention; any nitride semiconductor other than GaN may instead be used.

For another example, although the embodiment described above deals with an example where the bar-shaped semiconductor laser chip is used as a light source in an exposure machine or the like, this is not meant to limit the invention; the bar-shaped semiconductor laser chip may instead be used as other than a light source in an exposure machine.

For yet another example, although the embodiment described above deals with an example where the off-angle of the main surface of the GaN substrate decreases in direction A (the [11-20] direction) and in addition the central part of the main surface of the GaN substrate has an off-angle of about 0.05±0.1 degrees as measured, while facing in direction A (the [11-20] direction), from the (0001) plane to the direction-C ([0001]-direction) side, this is not meant to limit the invention; the off-angle of the main surface of the GaN substrate may instead increases in direction A (the [11-20] direction), in which case the central part of the main surface of the GaN substrate may have an off-angle of about 0.05±0.1 degrees as measured, while facing in the direction (the [−1-120] direction) opposite to direction A, from the (0001) plane to the direction-C ([0001]-direction) side. This will yield the same result as in the experiment described above.

What is claimed is:

1. A bar-shaped semiconductor laser chip comprising:
   a nitride semiconductor substrate; and
   a semiconductor layer formed on a main surface of the nitride semiconductor substrate and comprising a plurality of laser chip portions,
   wherein
   the plurality of laser chip portions are arrayed in a [11-20] direction,
   the main surface of the nitride semiconductor substrate is a (0001) plane having an off-angle in a direction along the [11-20] direction, and
   a central part of the main surface of the nitride semiconductor substrate has an off-angle of 0.05±0.1 degrees from the (0001) plane in the direction along the [11-20] direction
   wherein
   when the off-angle of the main surface of the nitride semiconductor substrate decreases in the [11-20] direction, the central part of the main surface of the nitride semiconductor substrate has an off-angle of 0.05±0.1 degrees as measured, while facing in the [11-20] direction, from the (0001) plane to the [0001]-direction side, and
   when the off-angle of the main surface of the nitride semiconductor substrate increases in the [11-20] direction, the central part of the main surface of the nitride semiconductor substrate has an off-angle of 0.05±0.1 degrees as measured, while facing in the [-1-120] direction, from the (0001) plane to the [0001]-direction side.

2. The bar-shaped semiconductor laser chip according to claim 1,
   wherein the central part of the main surface of the nitride semiconductor substrate has an off-angle larger than 0 degrees but smaller than 0.1 degrees from the (0001) plane in the direction along the [11-20] direction.

3. The bar-shaped semiconductor laser chip according to claim 1,
   wherein a difference between an oscillation wavelength of an endmost one of the laser chip portions in the [11-20] direction and an oscillation wavelength of an endmost one of the laser chip portions in the [-1-120] direction is 2 nm or less.

4. The bar-shaped semiconductor laser chip according to claim 1,
   wherein the nitride semiconductor substrate comprises a GaN substrate.

5. The bar-shaped semiconductor laser chip according to claim 1,
   wherein the central part of the main surface of the nitride semiconductor substrate has an off-angle larger than 0 degrees but smaller than 0.1 degrees from the (0001) plane in the direction along the [11-20] direction.

6. The bar-shaped semiconductor laser chip according to claim 1,
   wherein a difference between an oscillation wavelength of an endmost one of the laser chip portions in the [11-20] direction and an oscillation wavelength of an endmost one of the laser chip portions in the [-1-120] direction is 2 nm or less.

7. The bar-shaped semiconductor laser chip according to claim 5,
   wherein a difference between an oscillation wavelength of an endmost one of the laser chip portions in the [11-20] direction and an oscillation wavelength of an endmost one of the laser chip portions in the [-1-120] direction is 2 nm or less.

* * * * *